United States Patent [19]
Luchka

[11] Patent Number: 5,829,651
[45] Date of Patent: Nov. 3, 1998

[54] NONCONDUCTIVE HOLSTER FOR ELECTRICAL METER

[75] Inventor: John A. Luchka, Yonkers, N.Y.

[73] Assignee: Core Industries, Inc., Bloomfield Hills, Mich.

[21] Appl. No.: 811,921

[22] Filed: Mar. 5, 1997

[51] Int. Cl.⁶ .................................. A45F 5/00; G01R 1/04
[52] U.S. Cl. .......................... 224/267; 224/219; 224/930; 174/135; 324/156
[58] Field of Search ..................... 224/930, 267, 224/219, 676; 206/305; 73/431; 324/127, 117 R, 156, 157, 129, 149; 200/304, 305; 174/46, 135, 5 R, 5 SB; 16/114 R; D10/46; D3/218

[56] References Cited

U.S. PATENT DOCUMENTS

| | | | |
|---|---|---|---|
| D. 318,627 | 7/1991 | Frederick | D10/46 |
| D. 337,435 | 7/1993 | Kaneko et al. | D3/106 |
| 3,522,766 | 8/1970 | Wolbarst | 224/267 |
| 5,130,642 | 7/1992 | Hoffman et al. | 324/127 |

FOREIGN PATENT DOCUMENTS

| | | | |
|---|---|---|---|
| 545867 | 6/1993 | European Pat. Off. | 206/305 |
| 656388 | 1/1938 | Germany | 73/431 |

*Primary Examiner*—Linda J. Sholl
*Attorney, Agent, or Firm*—Weingarten, Schurgin, Gagnebin & Hayes LLP

[57] ABSTRACT

A nonconductive holster for use with an electrical meter is disclosed. The nonconductive holster comprises a protective guard for preventing a person who is using the electrical meter from coming into contact with any exposed power sources being measured with the electrical meter. The nonconductive holster is fabricated of a nonconductive resilient material which provides the electrical meter with a protective coating in the event that the electrical meter is accidentally dropped or inadvertently struck.

12 Claims, 3 Drawing Sheets

NONCONDUCTIVE HOLSTER FOR ELECTRICAL METER

FIELD OF INVENTION

The present invention relates generally to protective guards and, more particularly, to a nonconductive holster for use with an electrical meter.

BACKGROUND OF THE INVENTION

Measuring current accurately is a difficult job in today's industrial plants and commercial buildings. An increasing number of personal computers, adjustable speed motor drives, and other types of electronic equipment come on-line every day. These devices draw current in short pulses, which is why they are often referred to as non-linear loads.

Non-linear loads draw high peak currents, which cause harmonics in the load current. This may result in undesirable circuit breaker trippings and dangerous overheating of neutral conductors and transformers. Thus, it is often necessary to accurately measure these high peak currents in order to prevent or troubleshoot potentially dangerous electrical-related problems.

Because the electrical wiring within a typical plant or building is widely distributed, accurate electrical measurements must often be made at numerous various locations within the wiring network. This requires a portable measurement tool or electrical meter for making such measurements. Understandably, it would be desirable for the portable measurement tool or electrical meter to have some means of preventing a person who is using the portable measurement tool or electrical meter from coming into contact with any exposed power sources being measured with the portable measurement tool or electrical meter.

SUMMARY OF THE INVENTION

The primary object of the present invention is to provide a nonconductive holster for use with an electrical meter. The nonconductive holster comprises a protective guard for preventing a person who is using the electrical meter from coming into contact with any exposed power sources being measured with the electrical meter. The nonconductive holster is fabricated of a nonconductive resilient material, typically rubber, which provides the electrical meter with a protective coating in the event that the electrical meter is accidentally dropped or inadvertently struck. Furthermore, the material used in the fabrication of the nonconductive holster and the general shape of the nonconductive holster provide a user of the electrical meter with a means for securely gripping the electrical meter.

The above-stated primary object, as well as other objects, features, and advantages, of the present invention will become even more readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

Figure 3:
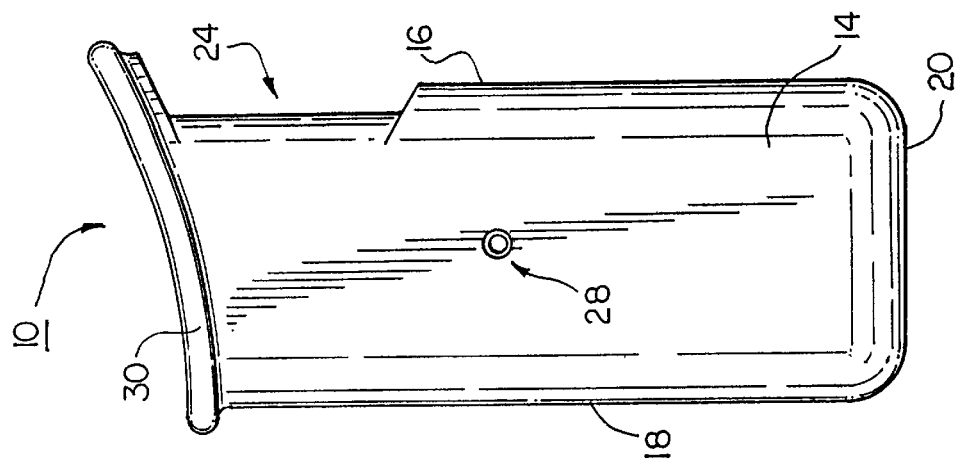
FIG. 3 is a rear view of the nonconductive holster shown in FIG. 1, taken along line 3—3 of FIG. 5.
Figure 2:
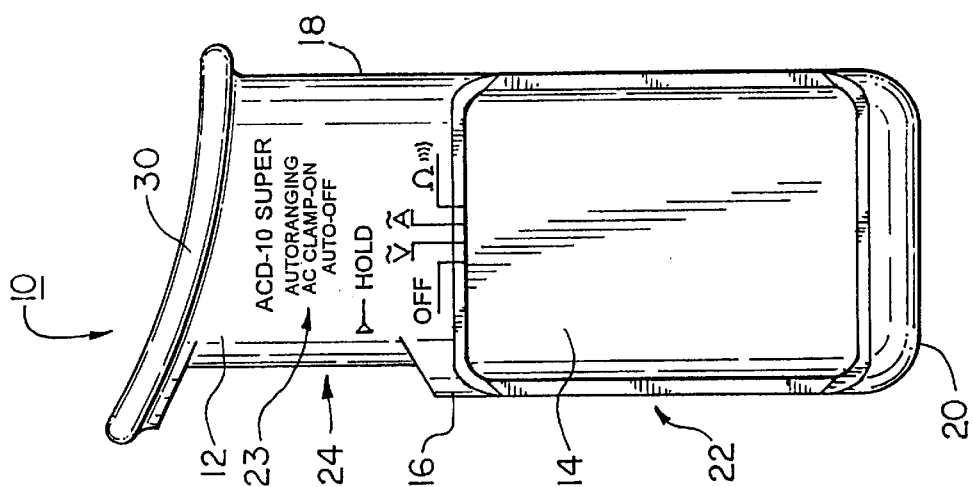
FIG. 2 is a front view of the nonconductive holster shown in FIG. 1, taken along line 2—2 of FIG. 4.
Figure 1:
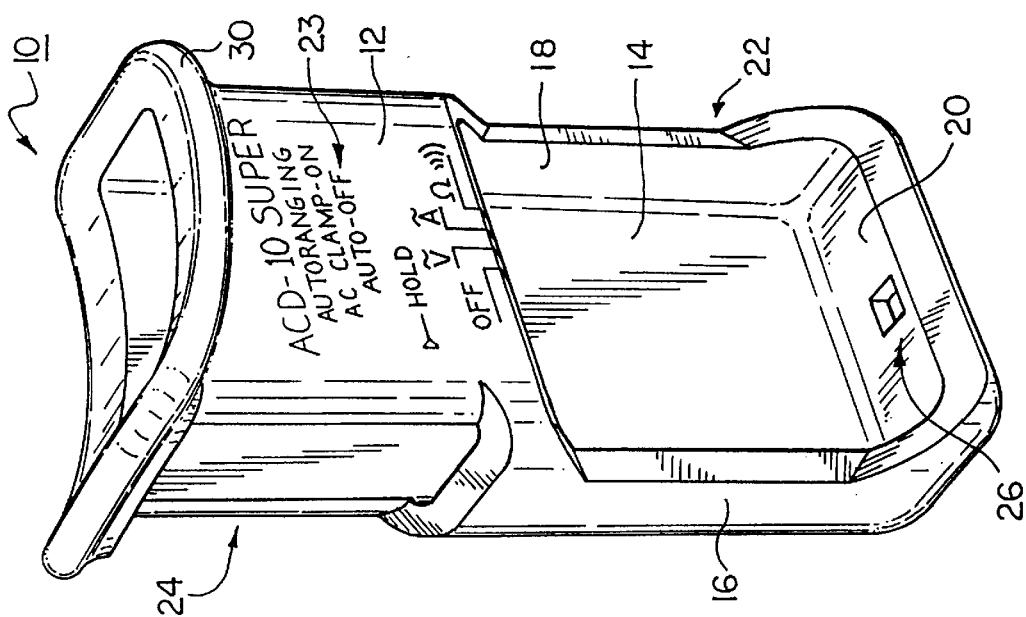
FIG. 1 is a perspective view of a nonconductive holster for use with an electrical meter according to the present invention.
Figure 6:
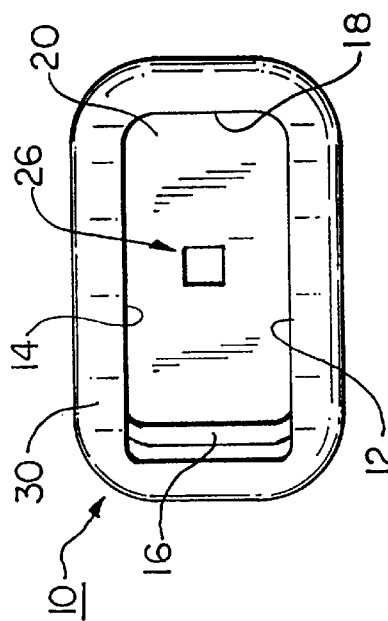
FIG. 6 is a top view of the nonconductive holster shown in FIG. 1, taken along line 6—6 of FIG. 3.
Figure 7:
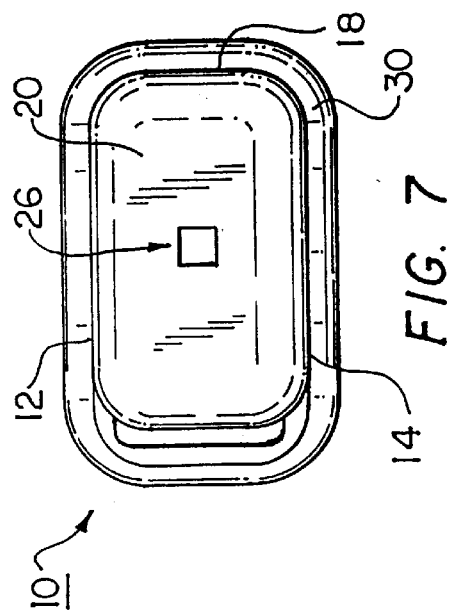
FIG. 7 is a bottom view of the nonconductive holster shown in FIG. 1, taken along line 7—7 of FIG. 3.
Figure 5:
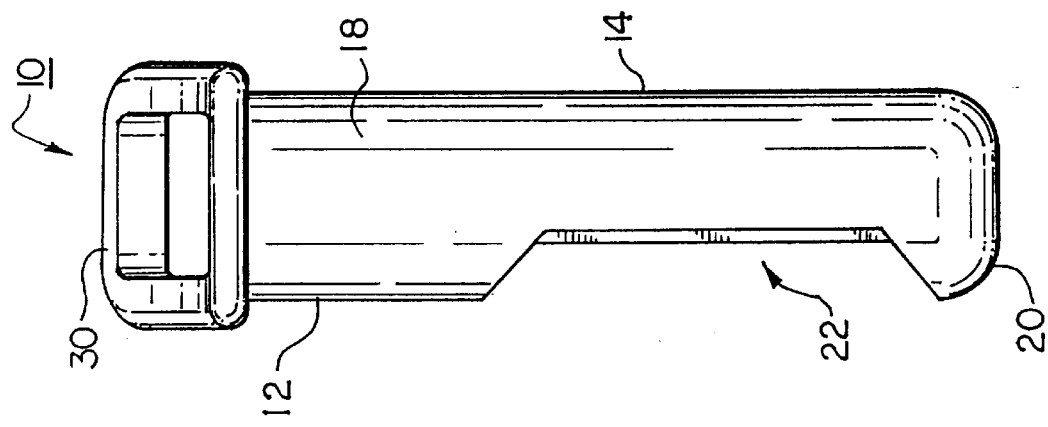
FIG. 5 is a right side view of the nonconductive holster shown in FIG. 1, taken along line 5—5 of FIG. 3.
Figure 4:
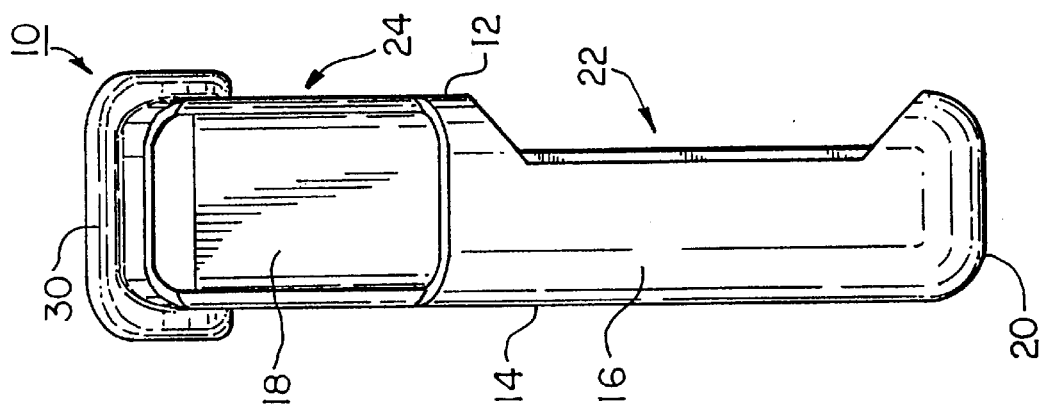
FIG. 4 is a left side view of the nonconductive holster shown in FIG. 1, taken along line 4—4 of FIG. 2.
Figure 8:
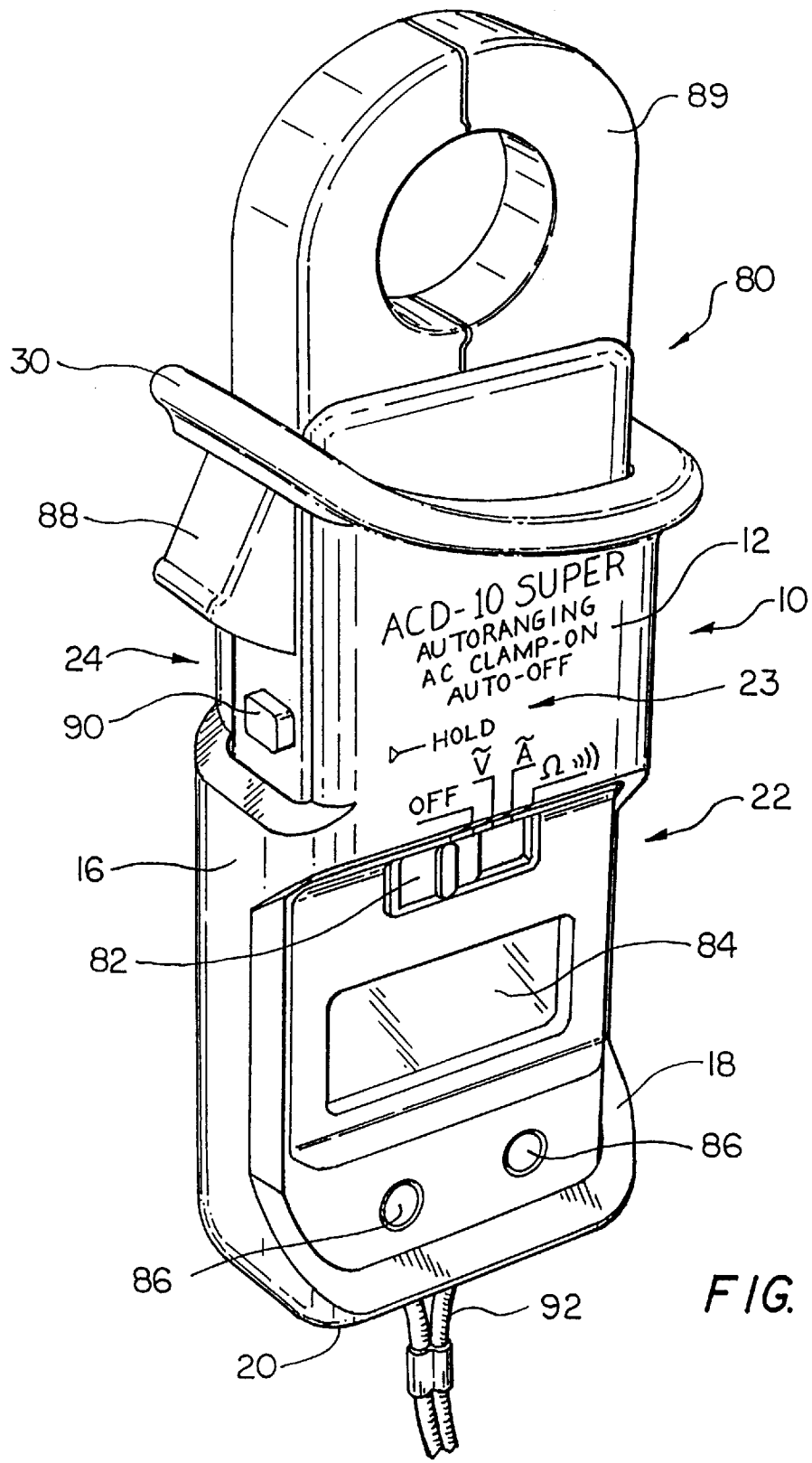
FIG. 8 is a perspective view of the nonconductive holster shown in FIG. 1, along with a mating electrical meter.

Referring to FIGS. 1–7, there are shown several views of a nonconductive holster 10 according to the present invention. The nonconductive holster 10 is made for use with an electrical meter 80, as shown in FIG. 8.

The holster 10 has a substantially rectangular box shape with several openings and projections formed therein. For example, the holster 10 has a front side 12, a back side 14, a left side 16, a right side 18, and a bottom side 20, all of which respectively intersect at areas having substantially rounded edges.

The front side 12 of the holster 10 has a first opening 22 formed in the lower half thereof for providing access to a control switch 82, an LCD display 84, and test ports 86 of the electrical meter 80. The first opening 22 partially wraps around into the left side 16 and right side 18 of the holster 10. The front side 12 of the holster 10 also has certain control and identification markings formed therein which relate to the workings and identification of the electrical meter 80.

The left side 16 of the holster 10 has a second opening 24 formed in the upper half thereof for providing access to a trigger 88 and a hold switch 90 of the electrical meter 80. The trigger 88 is used to open the current sensor jaws 89 of the electrical meter 80, while the hold switch 90 is used to maintain a present measurement value on the LCD display 84.

The bottom side 20 of the holster 20 has a third opening 26 formed substantially in center thereof for allowing a carrying strap 92 of the electrical meter 80 to be threaded therethrough.

The back side 14 of the holster 10 has a fourth opening 28 formed substantially in the center thereof for allowing a slotted screw to secure the electrical meter 80 within the holster 10.

The top end of the holster 10 is completely open for allowing the electrical meter 80 to be inserted into and out of the holster 10. A projection 30 is formed along the entire outside edge at the top end of the holster 10. This projection 30 provides a barrier between the hand of a user and any exposed electrical power sources being measured in the current sensor jaws 89 of the electrical meter 80. That is, the projection 30 prevents the hand of a user from slipping upwards toward the current sensor jaws 89 of the electrical meter 80.

As previously mentioned, the holster 10 is nonconductive. This further guards the user from any incidental contact that might occur between the holster 10 and any exposed electrical power sources being measured in the current sensor jaws 89 of the electrical meter 80.

The holster 10 is typically fabricated of rubber, but a variety of other nonconductive materials may also be used. For instance, nonconductive plastic may also be used.

The holster 10 is preferably fabricated of a resilient material, such as rubber, so as to provide a protective coating to the electrical meter 80. That is, a resilient holster 10 can protect the electrical meter 80 in the event that it is accidentally dropped or inadvertently struck.

The holster 10 is also preferably fabricated with a material having a non-slippery or tacky surface, such as rubber, so as to prevent the electrical meter 80 from slipping out of the hand of a user.

It should be noted that the holster 10 may be fabricated of several different materials which result in one or more of the above-mentioned preferences. It should also be noted that the holster 10 is typically fabricated with a mold.

The present invention is not to be limited in scope by the specific embodiment described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A holster for allowing a user to hold an electrical meter in an upright handheld operating position, the holster consisting essentially of an elongated sheath of nonconductive material configured to generally surround the electrical meter in the operating position, the sheath being substantially closed at the bottom end to retain the electrical meter in the operating position, the sheath being open at the top end to allow an upper part of the electrical meter to extend upwardly from the sheath in the operating position, the sheath having a projection at the top end configured to prevent the user's hand from sliding beyond the upper end in the operating position, the sheath also having an open section away from the open end, the open section being positioned and dimensioned to enable the user to access a lower part of the electrical meter in the operating position.

2. A holster according to claim 1, wherein the sheath is substantially rectangular in cross section.

3. The holster as defined in claim 1, wherein the sheath is fabricated of rubber.

4. The holster as defined in claim 1, wherein the sheath is fabricated of a resilient material.

5. The holster as defined in claim 4, wherein the sheath is fabricated of rubber.

6. The holster as defined in claim 1, wherein the sheath is a homogeneous construction.

7. The holster as defined in claim 1, wherein the sheath has a second open section adjacent to the upper end configured for providing access to a trigger and a hold switch of the electrical meter in the operating position.

8. The holster as defined in claim 1, wherein the bottom end of the sheath has a small opening for allowing a carrying strap of the electrical meter to be threaded therethrough.

9. The holster as defined in claim 1, wherein the sheath has a second open section for allowing a slotted screw to secure the electrical meter within the sheath.

10. The holster as defined in claim 1, wherein the exterior surface of the sheath has markings formed therein which relate to the workings and identification of the electrical meter.

11. The holster as defined in claim 1, wherein the open end of the sheath is shaped to allow the electrical meter to be inserted into and removed from the sheath.

12. A holster for allowing a user to hold an electrical meter in an upright handheld operating position, the holster consisting essentially of an elongated sheath of nonconductive material shaped in substantially rectangular cross section to generally surround the electrical meter in the operating position, the sheath being closed at the bottom end except for a small opening through which a carrying strap of the electrical meter is threaded when the electrical meter is retained in the operating position, the sheath being open at the top end to allow an upper part of the electrical meter to extend upwardly from the sheath in the operating position, the sheath having a projection at the top end configured to prevent the user's hand from sliding beyond the upper end in the operating position, the sheath having a first open section adjacent to the bottom end to enable the user to access a lower part of the electrical meter in the operating position, the sheath having a second open section adjacent to the upper end to provide access to a trigger and a hold switch of the electrical meter in the operating position.

* * * * *